United States Patent

Wada et al.

Patent Number: 5,217,945
Date of Patent: Jun. 8, 1993

[54] OXIDE SUPERCONDUCTORS AND METHOD FOR PRODUCING SAME

[75] Inventors: Takahiro Wada, Katano; Yuji Yaegashi, Tokyo; Ataru Ichinose, Yokohama; Nobuo Suzuki, Koganei; Hisao Yamauchi, Nagareyama; Shoji Tanaka, Tokyo, all of Japan

[73] Assignees: Matsushita Electric Industrial Co., Ltd., Osaka; Tohoku Electric Power Co., Inc., Miyagi; Central Research Institute of Electric Power Industry, Tokyo; The Tokyo Electric Power Co., Inc., Tokyo; International Superconductivity Technology Center, Tokyo, all of Japan

[21] Appl. No.: 754,996

[22] Filed: Sep. 5, 1991

[30] Foreign Application Priority Data

Sep. 18, 1990 [JP] Japan .................. 2-248432

[51] Int. Cl.$^5$ .................. H01B 12/00; H01B 1/08
[52] U.S. Cl. .................. 505/1; 505/779; 505/780; 501/152; 501/126; 501/123; 252/521
[58] Field of Search .................. 505/1, 729, 780; 501/152, 126, 123; 252/521

[56] References Cited

FOREIGN PATENT DOCUMENTS 0283620 9/1988 European Pat. Off. .

OTHER PUBLICATIONS

Y. Saito, "Preparation of High-Tc Oxide Superconductors–Fabrication of Bulk Ceramics," Oyobutsuri Applied Physics, vol. 57, No. 8, pp. 1217–1218, 1988.

M. Kosuge, et al, "Preparation and Physical Properties of Y1-xCa1.1x Ba2-0.1xCu3Oy," Japanese Journal of Applied Physics, vol. 27, No. 6, pp. L1022–L1024, Jun. 1988.

F. Devaux, et al, "Thermoelectric power of high-Tc superconductors," Physical Review B, vol. 41, No. 13, pp. 8723–8731, May 1990.

T. Wada, et al, "Substitution Effect of Sr for Ba of High-Tc Superconducting YBa2Cu3O7-y Ceramics," Japanese Journal of Applied Physics, vol. 26, No. 5, pp. L706–L708, May 1987.

J. M. Tarascon, et al, "Oxygen and rare-earth doping of the 90-K superconducting perovskite YBa2Cu3O7-x," Physical Review B, vol. 36, No. 1, pp. 226–234, Jul. 1987.

*Primary Examiner*—Mark L. Bell
*Assistant Examiner*—C. M. Bonner
*Attorney, Agent, or Firm*—Stevens, Davis, Miller & Mosher

[57] ABSTRACT

The present invention provides an oxide superconductor which has a relatively high transition temperature $T_c$. This superconductor has the chemical formula $(R_{1-x}Ca_x)(Ba_{1-y}Sr_y)_2Cu_3O_{7-z}$ wherein R is at least one rare earth element selected from the group consisting of Tm, Yb and Lu, x is with in the range of $0.1 \leq \times 0.5$, y is within the range of $0.1 \leq y \leq 0.4$ and z is within the range of $0.05 \leq z \leq (x/2+0.5)$. The invention further provides a method for producing the oxide superconductor which comprises firing a composition of the formula $(R_{1-x}Ca_x)(Ba_{1-y}Sr_y)_2Cu_3O_{7-z}$ wherein R is at least one rare earth element selected from the group consisting of Tm, Yb and Lu, x is within the range of $0.1 \leq X \leq 0.5$ and y is within the range of $0.1 \leq y \leq 0.4$ at a temperature of from 750° C. to the melting temperature of the composition under an oxygen partial pressure $P(O_2)$ of $0.001$ atm $\leq P(O_2) \leq 0.2$ atm and then heat treating the composition to adjust the oxygen loss z to $0.05 \leq z \leq (x/2+0.5)$.

2 Claims, 4 Drawing Sheets

OXIDE SUPERCONDUCTORS AND METHOD FOR PRODUCING SAME

BACKGROUND OF THE INVENTION

1. Field of the Invention

The present invention relates to an oxide superconductor having a relatively high superconductivity transition temperature $T_c$ and a method for producing it.

2. Description of Related Art $YBa_2Cu_3O_{7-z}$ ($0 \leq z \leq 1.0$) has been known as an oxide superconductor having a superconductivity transition temperature ($T_c = 90K$). It has also been known that substitution for a part of Y of other rare earth element(s) R causes substantially no change of $T_c$.

However, in order that the superconductors $RBa_2Cu_3O_{7-z}$ can have a high $T_c$, the process for the production thereof must be controlled so that the oxygen loss Z is close to zero (0). For this purpose, heat treatment for a long time of, for example, 5-10 hours at a temperature of 400°-450° C. has been generally needed after firing materials at a temperature of 900°-950° C. in an oxygen gas and annealing them at a cooling rate of 1°-2° C./min. ["OYOBUTURI", Vol. 57 (1988), pp. 1217-1218]. Such heat treatment has complicated the process for the production of the above-mentioned type superconductors and this has caused increase in cost for the production of wires or thin films therefrom.

Hitherto, for obtaining the effect as of the present invention, it has been attempted to substitute Ca at the Y site of $YBa_2Cu_3O_{7-z}$. Kosuge, B. Okai, K. Takahashi and M. Ohta, "Jpn. J. Appl. Phys.", 27 (1988), pp. L1022-L1024]. However, since the amount of Ca to form a solid solution with Y, namely, the amount (x) of Ca substituted in $(Y_{1-x}Ca_x)Ba_2Cu_3O_{7-z}$ is small (0.1 or less), no sufficient effect has been obtained. [F. Devaux, A. Manthiram and J. B. Goodenough, "Physical Review B", Vol. 41 (1990), pp. 8723-8731].

Furthermore, it has been known to substitute a rare earth element at the Y site of $YBa_2Cu_3O_{7-z}$. [J. M. Tarascon, W. R. McKinnon, L. H. Greene, G. W. Hull and E. M. Vogel, "Physical Review B", Vol. 36 (1987), pp. 226-233].

Moreover, it has also been known to substitute Sr at the Ba site of $YBa_2Cu_3O_{7-z}$. [T. Wada, S. Adachi, T. Mihara and R. Inaba, "Jpn. J. Appl. Phys.", 26 (1987), pp. L706-L-708].

SUMMARY OF THE INVENTION

An object of the present invention is to provide a superconductor which requires no long-time heat treatment for the production thereof by increasing the amount of Ca substituted at the Y site of $YBa_2Cu_3O_{7-z}$.

Another object of the present invention is to provide a method for producing the superconductor.

That is, the present invention provides an oxide superconductor having the formula $(R_{1-x}Ca_x)(Ba_{1-y}Sr_y)_2Cu_3O_{7-z}$ wherein R is at least one rare earth element selected from the group consisting of Tm, Yb and Lu, x satisfies $0.1 \leq x \leq 0.5$, y satisfies $0.1 \leq y \leq 0.4$ and z satisfies $0.05 \leq z \leq x/2 + 0.5$.

Furthermore, the present invention also provides a method for producing the above oxide superconductor which comprises firing a composition $(R_{1-x}Ca_x)(Ba_{1-y}Sr_y)_2Cu_3O_{7-z}$ wherein R is at least one rare earth element selected from the group consisting of Tm, Yb and Lu, x satisfies $0.1 \leq x \leq 0.5$ and y satisfies $0.1 \leq y \leq 0.4$, at a temperature of from 750° C. to the melting temperature of the composition under an oxygen partial pressure $P(O_2)$ of $0.001$ atm $\leq P(O_2) \leq 0.2$ atm and then heat treating the composition to adjust oxygen loss z to $0.05 \leq z \leq (x/2 + 0.5)$.

DETAILED DESCRIPTION OF PREFERRED EMBODIMENT

Figure 1:
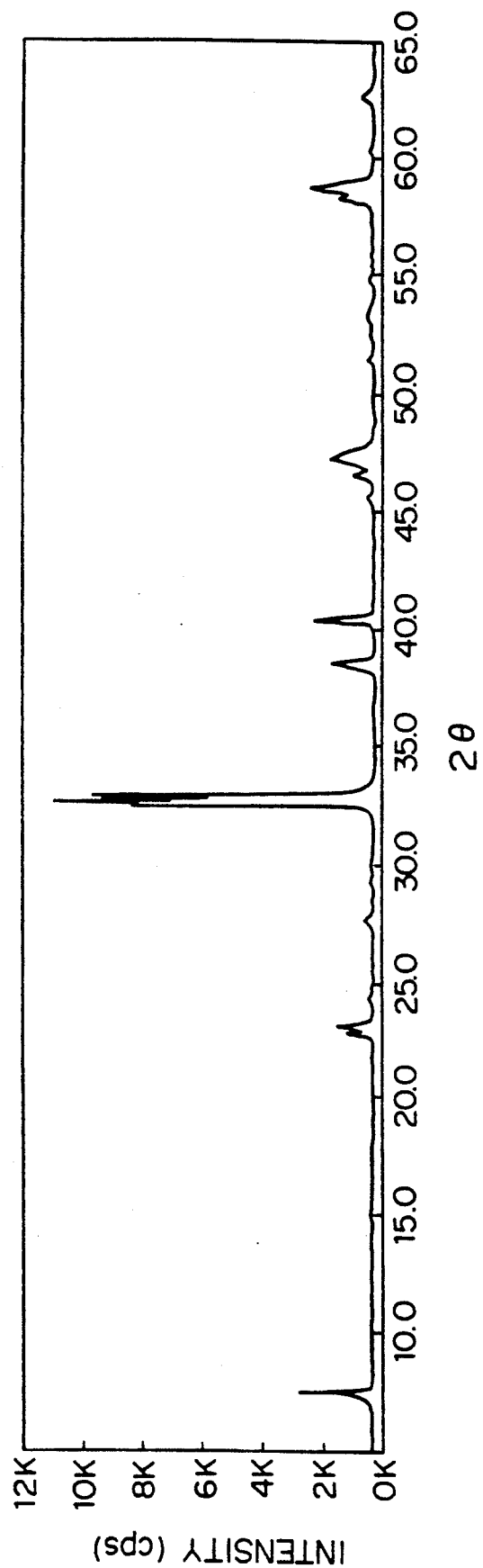
FIG. 1 is an X-ray powder diffraction pattern of Sample 4 obtained in Example 1 according to the present invention.

The above objects of the present invention can be attained by (a) substituting for Y in the oxide superconductor $YBa_2Cu_3O_{7-z}$ a rare earth elemention having an ionic radius smaller than that of Y, namely, at least one of Tm, Yb and Lu and (b) substituting Sr for a part of Ba.

In other words, the objects of the present invention have been attained by increasing the amount of Ca substituted for Y and combining the above (a) and (b).

As aforementioned, conventionally the production of $YBa_2Cu_3O_{7-z}$ has required a long-time heat treatment at a temperature of 300°-500° C. in an oxygen atmosphere. This is for the following reasons.

(a) The amount of oxygen $(7-z)$ varies depending on the temperature and the atmosphere (oxygen partial pressure) through which $YBa_2Cu_3O_{7-z}$ has passed after fired. The amount of oxygen is near 6 in the case of high temperatures (low oxygen partial pressure) and increases in the case of low temperatures (high oxygen partial pressure) and it is near 7 when oxygen is sufficiently absorbed in the composition (by the heat treatment of a long period at a temperature of 300°-500° C. in an oxygen atmosphere). It is said that the oxygen amount of the composition is usually about 6.93 when sufficiently adsorbed.

(b) Superconductive characteristics (e.g., superconductivity transition temperature) of $YBa_2Cu_3O_{7-z}$ depend greatly upon oxygen amount $(7-z)$. The oxygen amount of the compositions which become superconductors of the order of 90K are about 6.9.

On the other hand, the inventors have found in the superconductors of the present invention that (a) the maximum $T_c$ is obtained at an oxygen amount of about 6.6 (though the amount of oxygen which provides the maximum $T_c$ varies depending on Ca concentration) and (b) the heat treatment for "a long period at a temperature 300°-500° C." in an oxygen atmosphere is not required for attaining the oxygen amount of 6.6.

The oxygen amount of about 6.6 which exhibits the maximum $T_c$ can be attained merely by gradually cooling the composition in the air without special processes. When the composition is fired in oxygen, it may be rapidly cooled after fired.

In short, the superconductor of the present invention is characterized in that it can have good superconductivity without forcedly absorbing oxygen into the composition to allow the oxygen amount to be near 7. In other words, Ca is partially substituted for Y by studying the composition in place of absorbing oxygen in the process at a low temperature and long time. With increase in the substitution amount of Ca, the oxygen amount may be less.

A preferred composition of the superconductor of the present invention is $(R_{1-x}Ca_x)(Ba_{1-y}Sr_y)_2Cu_3O_{7-z}$ which corresponds to $RBa_2Cu_3O_{7-z}$ where Ca is substituted for a part of the rare earth element R and Sr is substituted for a part of Ba. In this composition, R is at least one rare earth element selected from the group consisting of Tm, Yb and Lu, x is within the range of $0.1 \leq x \leq 0.5$, y is within the range of $0.1 \leq y \leq 0.4$, and z is within the range of $0.05 \leq z \leq (x/2+0.5)$. More preferably, the oxygen loss z is within the range of $0.4 \leq z \leq (x/2+0.5)$. The superconductor can be prepared preferably by firing the composition under an oxygen partial pressure $P(O_2)$ within the range of $0.01$ atm $\leq P(O_2) \leq 0.2$ atm and adjusting the oxygen loss by the subsequent heat treatment.

The heat treating temperature is between 750° C. and the melting temperature of the composition of the superconductor. The heat treating time varies depending on the state of the starting materials, temperature and atmosphere.

When the above-mentioned composition is employed, a 1-2-3 type oxide superconductor of relatively high $T_c$ can be produced inexpensively without carrying out a long-term heat treatment at a temperature of 300°-500° C. in an oxygen atmosphere.

Therefore, the superconductor of the present invention can be made into a silver sheathed wire without the final step of annealing at low temperatures in an oxygen atmosphere. Naturally, formation of a thin film also does not require the final step of annealing at low temperatures in an oxygen atmosphere. Furthermore, the superconductors of the present invention having an oxygen loss z of $0.4 \leq z \leq (x/2+0.5)$ have a tetragonal crystal structure. Thus, no twin crystal structure is seen which is the characteristic of 1-2-3 type oxide superconductors. This is effective for formation of a uniform thin film.

The oxide superconductors of the present invention have a $T_c$ of 50K or higher and can be relatively easily made into a wire or a thin film since there is no need to carry out the final step of a longtime heat treatment in an oxygen atmosphere when a silver-sheathed wire or a thin film is to be produced.

The present invention will be explained by the following examples.

EXAMPLE 1

A $Yb_2O_3$ powder, $BaCO_3$ powder, CuO powder, $CaCO_3$ powder, and $SrCO_3$ powder, the purity of each powder being 99.9%, were mixed so that the composition as shown in Table 1 was obtained in the chemical formula $(Yb_{1-x}Ca_x)(Ba_{1-y}Sr_y)_2Cu_3O_{7-z}$ and the resulting mixture was calcined twice at 850° C. for 10 hours in the air. Then, the calcined mixture was sufficiently ground and mixed and the mixed powders were molded into a rectangle. This molded product was sintered at 850° C. for 50 hours in an atmosphere of 0.01 atm in oxygen partial pressure (a mixed gas of oxygen gas and nitrogen gas) and gradually cooled after the atmosphere was replaced by air to obtain a desired sample.

The phase produced in the thus obtained sintered body of $(Yb_{1-x}Ca_x)(Ba_{1-y}Sr_y)_2Cu_3O_{7-z}$ was identified by the X-ray powder diffractometry. The results are also shown in Table 1. In Table 1, M indicates a mixed phase containing considerable impurity components, O indicates a single phase of rhombic system, and T indicates a single phase of tetragonal system. The oxygen loss z in the samples of a single phase was determined by an electrochemical analytical method [K. Kurusu et al, "ANALYST", Vol. 114 (1989), pp. 1341-1343]. The results are also shown in Table 1. The symbol "-" means that the sample comprised mixed phase and z could not be determined.

It is recognized from Table 1 that $(Yb_{1-x}Ca_x)(Ba_{1-y}Sr_y)_2Cu_3O_{7-z}$ of a single phase is obtained when x is within the range of $0.1 \leq x \leq 0.5$ and y is within the range of $0.1 \leq y \leq 0.4$. The x-ray powder diffraction pattern of Sample 4 is shown in FIG. 1. FIG. 1 shows that Sample 4 is of $YBa_2Cu_3O_{7-z}$ type of a tetragonal system.

Figure 2:
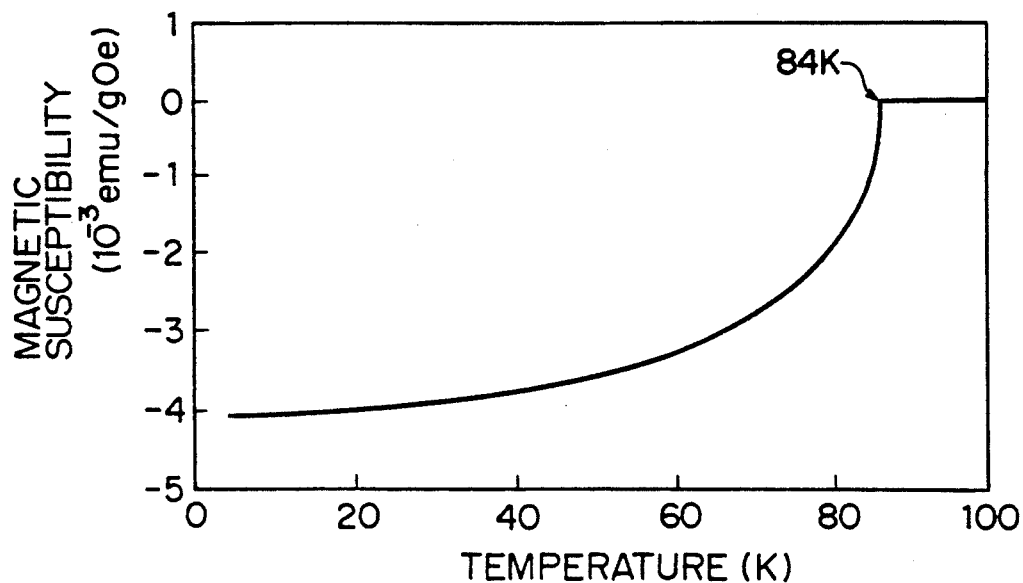
FIG. 2 is a graph which shows the relation of magnetic susceptibility - temperature of the Sample 4.
Figure 3:
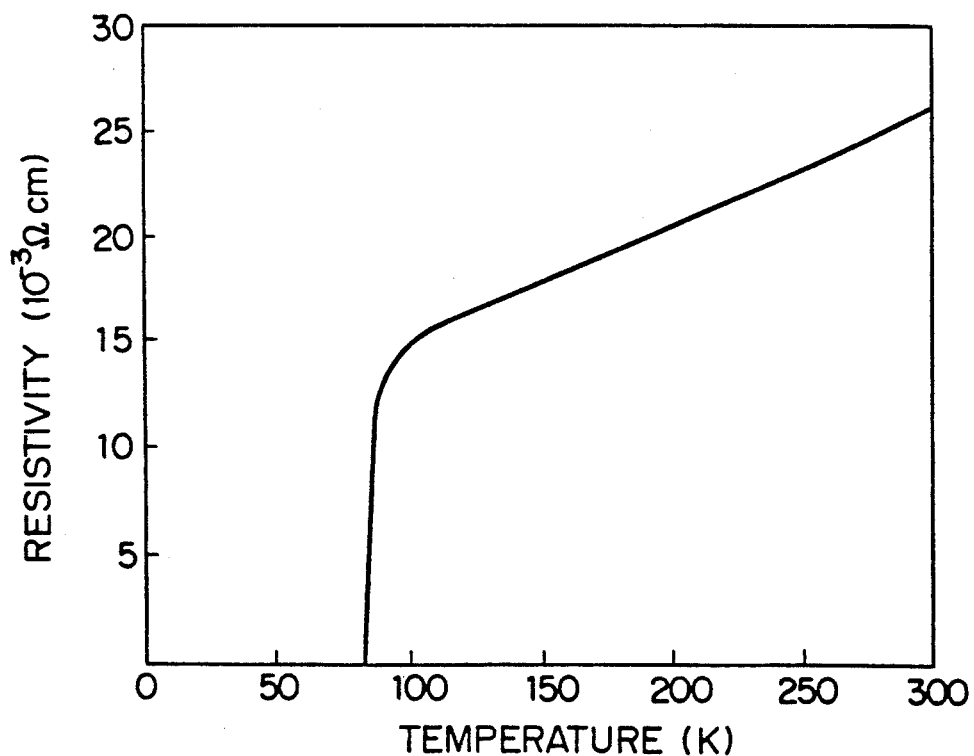
FIG. 3 is a graph which shows the relation of resistivity—temperature of the Sample 4.

The superconductive characteristics of these samples were evaluated by measuring magnetic susceptibility using SQUID. The magnetic susceptibility—temperature characteristics and resistivity—temperature characteristics of Sample 4 are shown in FIG. 2 and FIG. 3, respectively. The superconductivity transition temperature $T_c$ and magnetic susceptibility $\chi$ at 10K which were obtained from the measurement of the magnetic susceptibility are shown in Table 2. The magnetic susceptibility $\chi$ at 10K is used for evaluation of the volume fraction of the superconductive phase. Usually, the magnetic susceptibility of $10^{-3}$ emu/gOe or higher indicates a bulk superconductor. Therefore, as is clear from Table 2, those which are desirable from the point of applications are bulk superconductors having a $T_c$ of 50K or higher. The samples in this Example which satisfy this characteristic are those of the formula wherein x is within the range of $0.1 \leq x \leq 0.5$ and y is within the range of $0.1 \leq y \leq 0.4$.

EXAMPLE 2

Sample 2 (oxygen amount: 6.80) and Sample 4 (oxygen amount: 6.56) prepared in Example 1 were subjected to the heat treatment to prepare samples having various oxygen losses z as shown in Table 3 and Table 5. As can be seen from Table 3, Samples 13 and 14 were increased in their oxygen amount than Sample 2 and Samples 15-20 were reduced in their oxygen amount than Sample 2. As can be seen from Table 5, Samples 21-25 were increased in their oxygen amount than Sample 4 and Samples 26-28 were reduced in their oxygen amount than Sample 4. The superconductive characteristics of these samples are shown in Table 4 and Table 6.

Figure 4:
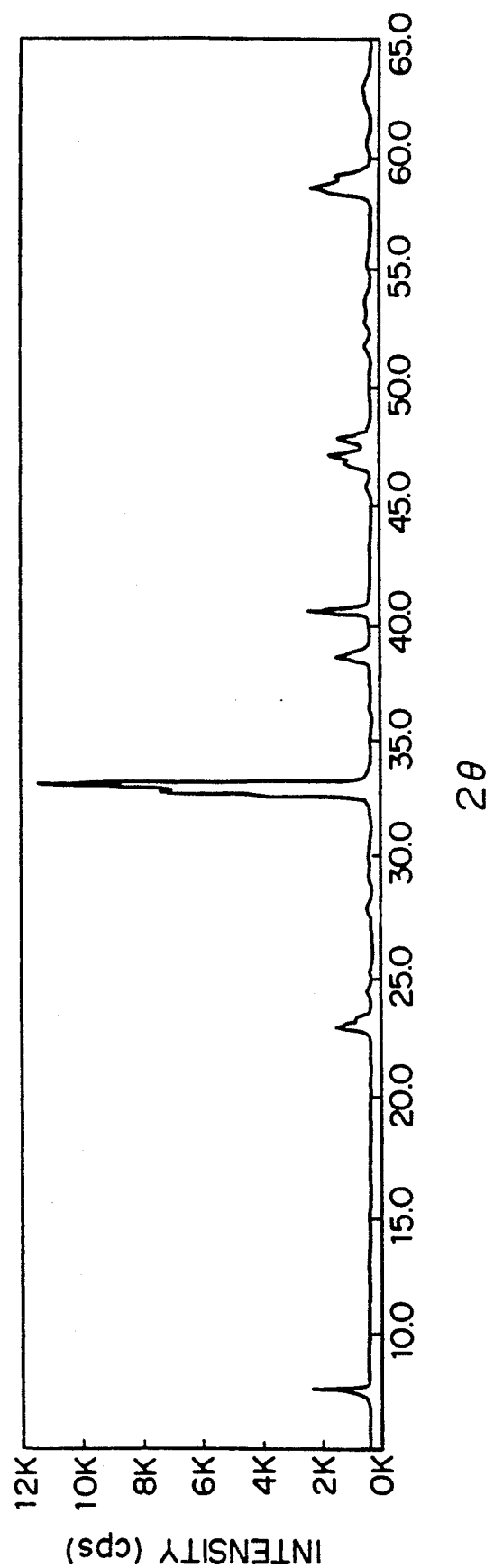
FIG. 4 is an X-ray powder diffraction pattern of Sample 23 obtained in Example 2 according to the present invention.
Figure 5:
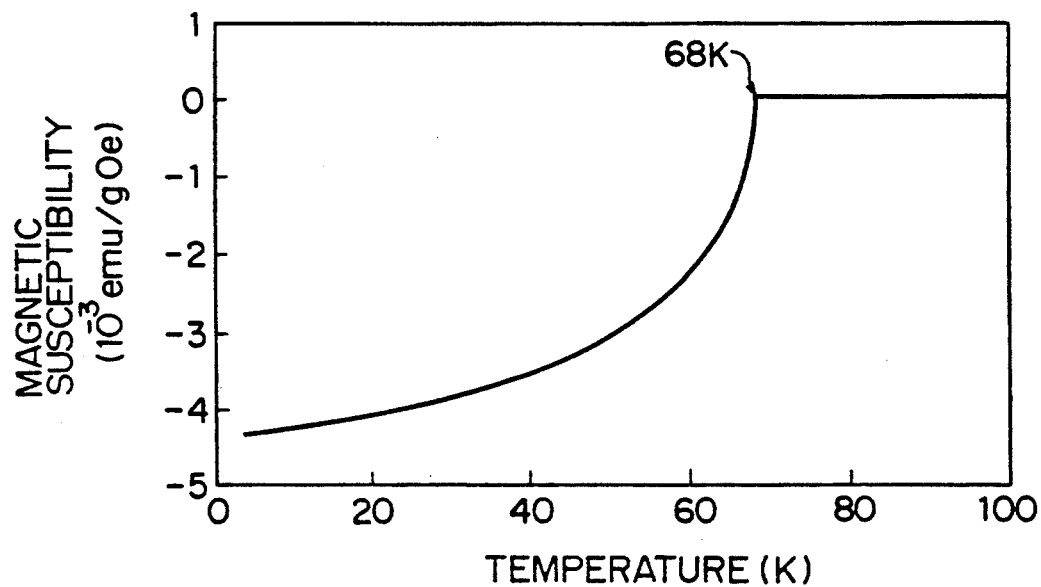
FIG. 5 is a graph which shows the relation of magnetic susceptibility—temperature of the Sample 23.
Figure 6:
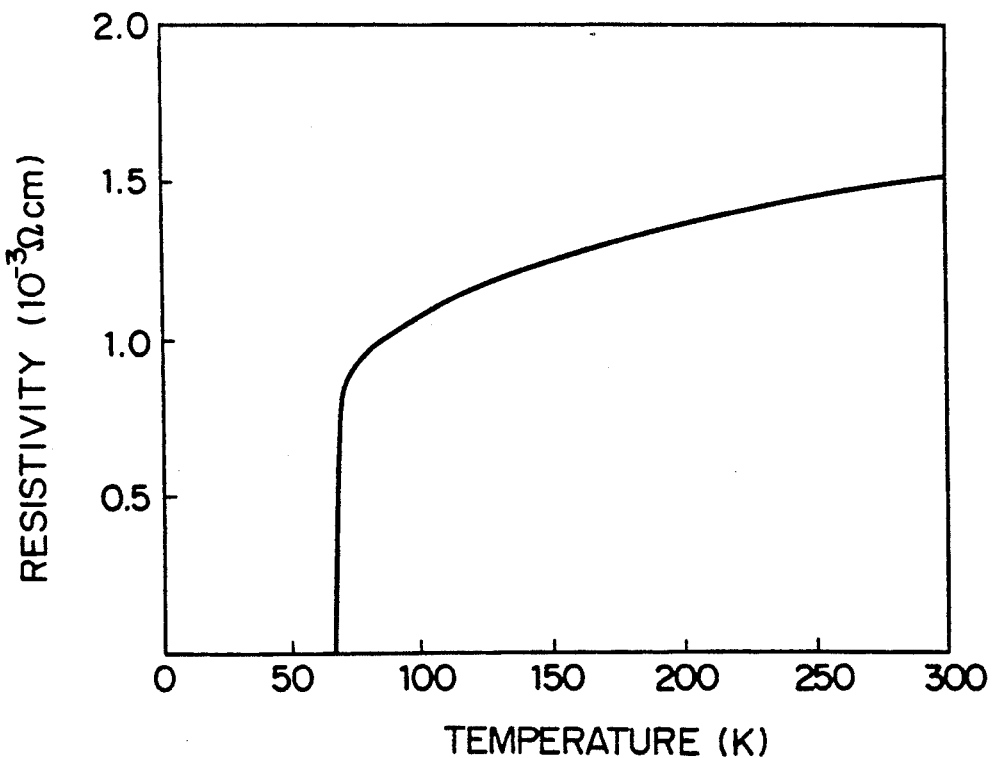
FIG. 6 is a graph which shows the relation of resistivity—temperature of the Sample 23.

It can be seen from the results that desirable oxygen loss z varies depending on the amount (x) of Ca substituted and is within the range of $0.05 \leq z \leq (x/2+0.5)$. Further, the samples of a tetragonal system which have good superconductive characteristics can be obtained when z is within the range of $0.4 \leq z \leq (x/2+0.5)$. The X-ray powder diffraction pattern, the magnetic susceptibility—temperature characteristics and resistivity—temperature characteristics of Sample 23 are shown in FIGS. 4-6.

As a method of heat treatment for increasing the oxygen amount, there is a heat treatment at low temperatures (300°-500° C.)/high oxygen partial pressures (effect can be obtained by satisfying either one of them and a heat treatment at a low temperature and in the air was carried out in Example 2). As the method of heat treatment for reducing the oxygen amount, there is a heat treatment of rapid cooling from a high temperature or a heat treatment under a low oxygen partial pressure. It is natural that the composition can be fired under a low oxygen partial pressure and rapidly cooled as it is. The latter method was employed in Example 2.

EXAMPLE 3

Samples were prepared in the same manner as in Example 1 except that Yb was replaced with Tm or Lu or a mixture of Yb with Tm or Lu in Sample 4, $(Yb_{0.7}Ca_{0.3})(Ba_{0.8}Sr_{0.2})_2Cu_3O_{7-z}$. The samples obtained were evaluated in the same manner as in Example 1. The compositions of the samples are shown in Table 7 and the superconductive characteristics thereof are shown in Table 8. As a result, it was found that even when the rare earth element R was changed from Yb to Tm or Lu, the results obtained were similar to those when R was Yb. Moreover, it was also found that combination of Yb with Tm or Lu gave the similar results.

EXAMPLE 4

A sample having the chemical formula, $(Yb_{0.7}Ca_{0.3})(Ba_{0.8}Sr_{0.2})_2Cu_3O_{7-z}$, namely, same in x and y as Sample 4 of Example 1 was twice calcined in the air at 850° C. for 10 hours and thereafter, sufficiently ground and mixed and the mixed powders were molded into rectangles as in Example 1. These molded products were sintered in atmospheres (mixed gases of oxygen gas and nitrogen gas) having oxygen partial pressures of 0.0001 atm (Sample 35), 0.001 atm (Sample 36), 0.2 atm (Sample 37) and 1 atm (Sample 38) at 850° C. for 50 hours and were gradually cooled after the atmosphere was replaced by air to obtain desired Samples 35-38. The superconductive characteristics of these samples are shown in Table 9. It can be seen from Table 9 that the desirable superconductive characteristics can be obtained when oxygen partial pressure $P(O_2)$ is within the range of 0.001 atom $\leq P(O_2) \leq 0.2$ atm.

TABLE 1

$(Yb_{1-x}Ca_x)(Ba_{1-y}Sr_y)_2Cu_3O_{7-z}$

| Sample | x | y | 7 − z | Phase |
|---|---|---|---|---|
| 1 | 0.0 | 0.2 | — | M |
| 2 | 0.1 | 0.2 | 6.80 | O |
| 3 | 0.2 | 0.2 | 6.67 | O |
| 4 | 0.3 | 0.2 | 6.56 | T |
| 5 | 0.4 | 0.2 | 6.53 | T |
| 6 | 0.5 | 0.2 | 6.50 | T |
| 7 | 0.6 | 0.2 | — | M |
| 8 | 0.3 | 0.0 | — | M |
| 9 | 0.3 | 0.1 | 6.62 | O |
| 10 | 0.3 | 0.3 | 6.60 | T |
| 11 | 0.3 | 0.4 | 6.58 | T |
| 12 | 0.3 | 0.5 | — | M |

TABLE 2

| Sample | Transition temperature $T_c(K)$ | Magnetic susceptibility at 10K $\chi(10^3$ emu/gOe) |
|---|---|---|
| 1 | 80 | 0.72 |
| 2 | 82 | 2.75 |
| 3 | 83 | 3.52 |
| 4 | 84 | 4.06 |
| 5 | 73 | 3.75 |
| 6 | 80 | 2.57 |
| 7 | 79 | 0.86 |
| 8 | 82 | 0.65 |
| 9 | 83 | 3.28 |
| 10 | 84 | 3.52 |
| 11 | 82 | 2.77 |
| 12 | 80 | 0.95 |

TABLE 3

$(Yb_{1-x}Ca_x)(Ba_{1-y}Sr_y)_2Cu_3O_{7-z}$

| Sample | x | y | 7 − z | Phase |
|---|---|---|---|---|
| 13 | 0.1 | 0.2 | 6.92 | O |
| 14 | 0.1 | 0.2 | 6.85 | O |
| 15 | 0.1 | 0.2 | 6.70 | O |
| 16 | 0.1 | 0.2 | 6.63 | O |
| 17 | 0.1 | 0.2 | 6.60 | T |
| 18 | 0.1 | 0.2 | 6.53 | T |
| 19 | 0.1 | 0.2 | 6.45 | T |
| 20 | 0.1 | 0.2 | 6.35 | T |

TABLE 4

| Sample | Transition temperature $T_c(K)$ | Magnetic susceptibility at 10K $\chi(10^3$ emu/gOe) |
|---|---|---|
| 13 | 48 | 3.25 |
| 14 | 72 | 3.22 |
| 15 | 81 | 5.22 |
| 16 | 80 | 4.67 |
| 17 | 74 | 4.20 |
| 18 | 65 | 3.56 |
| 19 | 58 | 3.77 |
| 20 | 48 | 2.55 |

TABLE 5

$(Yb_{1-x}Ca_x)(Ba_{1-y}Sr_y)_2Cu_3O_{7-z}$

| Sample | x | y | 7 − z | Phase |
|---|---|---|---|---|
| 21 | 0.3 | 0.2 | 6.80 | O |
| 22 | 0.3 | 0.2 | 6.75 | O |
| 23 | 0.3 | 0.2 | 6.72 | O |
| 24 | 0.3 | 0.2 | 6.66 | O |
| 25 | 0.3 | 0.2 | 6.58 | T |
| 26 | 0.3 | 0.2 | 6.43 | T |
| 27 | 0.3 | 0.2 | 6.35 | T |
| 28 | 0.3 | 0.2 | 6.12 | T |

TABLE 6

| Sample | Transition temperature $T_c(K)$ | Magnetic susceptibility at 10K $\chi(10^3$ emu/gOe) |
|---|---|---|
| 21 | 35 | 2.45 |
| 22 | 65 | 3.36 |
| 23 | 68 | 4.24 |
| 24 | 80 | 4.67 |
| 25 | 82 | 4.50 |
| 26 | 64 | 3.75 |
| 27 | 52 | 2.59 |
| 28 | 40 | 0.88 |

TABLE 7

$(R_{0.7}Ca_{0.3})(Ba_{0.8}Sr_{0.2})_2Cu_3O_{7-z}$

| Sample | R | 7 − z | Phase |
|---|---|---|---|
| 29 | Tm | 6.54 | T |
| 30 | Lu | 6.51 | T |
| 31 | $Yb_{0.8}Lu_{8.2}$ | 6.55 | T |
| 32 | $Yb_{0.6}Lu_{0.4}$ | 6.54 | T |
| 33 | $Yb_{0.2}Lu_{0.8}$ | 6.52 | T |
| 34 | $Yb_{0.5}Tm_{0.5}$ | 6.58 | T |

TABLE 8

| Sample | Transition temperature $T_c(K)$ | Magnetic susceptibility at 10K $\chi(10^3$ emu/gOe) |
|---|---|---|
| 29 | 86 | 4.52 |
| 30 | 83 | 3.44 |
| 31 | 84 | 4.22 |
| 32 | 84 | 3.92 |
| 33 | 83 | 3.88 |
| 34 | 85 | 4.42 |

TABLE 9

| Sample | Transition temperature $T_c(K)$ | Magnetic susceptibility at 10K $\chi(10^3$ emu/gOe) |
|---|---|---|
| 35 | 72 | 0.85 |
| 36 | 82 | 4.22 |
| 37 | 84 | 4.15 |
| 38 | 65 | 0.77 |

The present invention has been specifically explained by the above Examples, but it is needless to say that the present invention is never limited thereto and various modifications can be made as far as they do not deviate from the scope of the present invention.

For example, the present invention can be applied to wiring of low-temperature electronics devices, magnetic shielding and the like.

What is claimed is:

1. An oxide superconductor having the chemical formula $(R_{1-x}Ca_x)(Ba_{1-y}Sr_y)_2Cu_3O_{7-z}$ wherein R is at least one rare earth element selected from the group consisting of Tm, Yb and Lu, x is with in the range of $0.1 \leq X \leq 0.5$, y is within the range of $0.1 \leq y \leq 0.4$ and z is within the range of $0.05 \leq z23$ (x/2+0.5).

2. An oxide superconductor according to clam 1, which has the chemical formula $(R_{1-x}Ca_x)(Ba_{1-y}Sr_y)_2Cu_3O_{7-z}$ wherein R is at least one rare earth element selected from the group consisting of Tm, Yb and Lu, x is with in the range of $0.1 \leq X \leq 0.5$, y is within the range of $0.1 \leq y \leq 0.4$ and z is within the range of $0.4 \leq z \leq$ (x/2+0.5).

* * * * *